United States Patent
Jaworski et al.

(10) Patent No.: US 7,511,525 B2
(45) Date of Patent: Mar. 31, 2009

(54) BOUNDARY-SCAN SYSTEM ARCHITECTURE FOR REMOTE ENVIRONMENTAL TESTING

(75) Inventors: Douglas S. Jaworski, St. Petersburg, FL (US); Daniel W. Snider, Tampa, FL (US)

(73) Assignee: Honeywell International Inc., Morristown, NJ (US)

( * ) Notice: Subject to any disclaimer, the term of this patent is extended or adjusted under 35 U.S.C. 154(b) by 80 days.

(21) Appl. No.: 11/340,295

(22) Filed: Jan. 26, 2006

(65) Prior Publication Data

US 2007/0170944 A1    Jul. 26, 2007

(51) Int. Cl.
   *G01R 31/02* (2006.01)
(52) U.S. Cl. ..................................... 324/763
(58) Field of Classification Search ................. 324/760, 324/763
   See application file for complete search history.

(56) References Cited

U.S. PATENT DOCUMENTS

| | | | | |
|---|---|---|---|---|
| 5,621,312 A * | 4/1997 | Achor et al. | ............. | 324/158.1 |
| 5,659,552 A | 8/1997 | Ke et al. | | |
| 5,841,788 A | 11/1998 | Ke | | |
| 5,852,617 A * | 12/1998 | Mote, Jr. | ..................... | 714/726 |
| 6,161,205 A * | 12/2000 | Tuttle | ......................... | 714/724 |
| 6,229,325 B1 * | 5/2001 | Browning et al. | ........... | 324/760 |
| 6,363,510 B1 * | 3/2002 | Rhodes et al. | ............... | 714/738 |
| 6,433,569 B1 * | 8/2002 | Eliashberg et al. | .......... | 324/760 |
| 6,560,734 B1 * | 5/2003 | Whetsel | ....................... | 714/724 |
| 6,822,469 B1 * | 11/2004 | Kline | ........................ | 324/765 |
| 6,900,650 B1 * | 5/2005 | Sheng et al. | ................. | 324/760 |
| 6,910,162 B2 * | 6/2005 | Co et al. | ..................... | 714/718 |
| 7,111,211 B1 * | 9/2006 | Co et al. | ..................... | 714/718 |
| 7,208,968 B2 * | 4/2007 | Weber et al. | ................. | 324/765 |
| 7,265,556 B2 | 9/2007 | Van Treuren et al. | | |
| 2003/0229835 A1 | 12/2003 | Whetsel | | |
| 2004/0225783 A1 * | 11/2004 | Erickson et al. | ............. | 710/200 |
| 2006/0242511 A1 | 10/2006 | Whetsel | | |
| 2007/0136631 A1 | 6/2007 | Govani et al. | | |
| 2007/0300109 A1 | 12/2007 | Whetsel | | |

* cited by examiner

*Primary Examiner*—Jermele M Hollington
*Assistant Examiner*—Richard Isla Rodas
(74) *Attorney, Agent, or Firm*—Fogg & Powers LLC (57) ABSTRACT

A system including a chassis operable to receive a plurality of physical application modules and a test port via which an external test device is communicatively coupled to the system. Each physical application module includes a module bridge interface and boundary-scan test functionality. The test port is communicatively coupled to each of a chassis bridge interface in the chassis. When the module bridge interface of each of the physical application modules is communicatively coupled to a respective one of the plurality of chassis bridge interfaces, the boundary-scan test functionality of the respective physical application module is communicatively coupled to the test port.

22 Claims, 5 Drawing Sheets

BOUNDARY-SCAN SYSTEM ARCHITECTURE FOR REMOTE ENVIRONMENTAL TESTING

GOVERNMENT LICENSE RIGHTS

The U.S. Government may have certain rights in the present invention as provided for by the terms of a restricted government contract.

This application is related to U.S. patent application Ser. No. 11/340,286 having a title of "METHOD AND SYSTEM FOR BACKPLANE TESTING USING BOUNDARY-SCAN UNITS" and U.S. patent application Ser. No. 11/340,390 having a title of "DIAGNOSTICS UNIT USING BOUNDARY-SCAN TECHNIQUES FOR VEHICLES", both of which are filed on the same date herewith.

BACKGROUND

Some devices and/or systems require testing in extreme environments. For example, such devices or systems (also collectively referred to here as "units under test" and individually as a "unit under test") are tested in a test chamber (also referred to here as an "environmental chamber") that provide the desired extreme environmental conditions for the unit under test for at least a portion of the testing. During formal qualification of a unit under test, opening the environmental chamber is typically not permitted by the testing protocol even if a portion of a unit under test fails. If the environmental chamber is opened to probe a failed device in the unit under test, to change out a failed part of the unit under test, or to directly troubleshoot the failed the unit under test, the testing can be compromised. For example, if the environmental chamber is opened during the testing, the operational characteristics of the failure may change. In some cases the failure is masked by the opening of the environmental chamber during the test.

Additionally, some units under test typically require testing in test chambers that are remotely located, such as for example, airborne vehicles. In such a case, it is typically not possible to probe, examine and/or replace any failed part of the unit under test. Likewise, some units under test typically require testing in test chambers that are remotely located and that can be subjected to extreme environments, such as for example, space vehicles orbiting above the atmosphere of the earth.

SUMMARY

A first aspect of the present invention provides a system including a chassis operable to receive a plurality of physical application modules and a test port via which an external test device is communicatively coupled to the system. Each physical application module includes a module bridge interface and boundary-scan test functionality. The test port is communicatively coupled to each of a chassis bridge interface in the chassis. When the module bridge interface of each of the physical application modules is communicatively coupled to a respective one of the plurality of chassis bridge interfaces, the boundary-scan test functionality of the respective physical application module is communicatively coupled to the test port.

A second aspect of the present invention provides a test system comprising a test chamber, a unit under test enclosed within the test chamber and an external test device external to the test chamber and the unit under test. The external test device is communicatively coupled to the unit under test. The unit under test includes a chassis operable to receive a plurality of physical application modules and a test port via which an external test device is communicatively coupled to the system. Each physical application module includes a module bridge interface and boundary-scan test functionality. The test port is communicatively coupled to each of a chassis bridge interface in the chassis. When the module bridge interface of each of the physical application modules is communicatively coupled to a respective one of the plurality of chassis bridge interfaces, the boundary-scan test functionality of the respective physical application module is communicatively coupled to the test port.

A third aspect of the present invention provides a method including communicatively coupling a test port of a unit under test to an external test device that is external to a test chamber, communicatively coupling boundary-scan test functionality included on each of a plurality of physical application modules to a test backplane, communicatively coupling the boundary-scan test functionality included on each of the plurality of physical application modules to the external test device via the test backplane and communicating data between the external test device and the boundary-scan test functionality included on at least one physical application module in order to test at least a portion of the at least one physical application module.

A fourth aspect of the present invention provides an apparatus comprising means for communicatively coupling a test port of a unit under test to a test device that is external to the test chamber, means for communicatively coupling boundary-scan test functionality included on each of a plurality of physical application modules to a test backplane, means for communicatively coupling the boundary-scan test functionality included on each of the plurality of physical application modules to the test device via the test backplane and means for communicating data between the test device and the boundary-scan test functionality included on at least one physical application module in order to test at least a portion of the at least one physical application module.

DRAWINGS

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Figure 1:
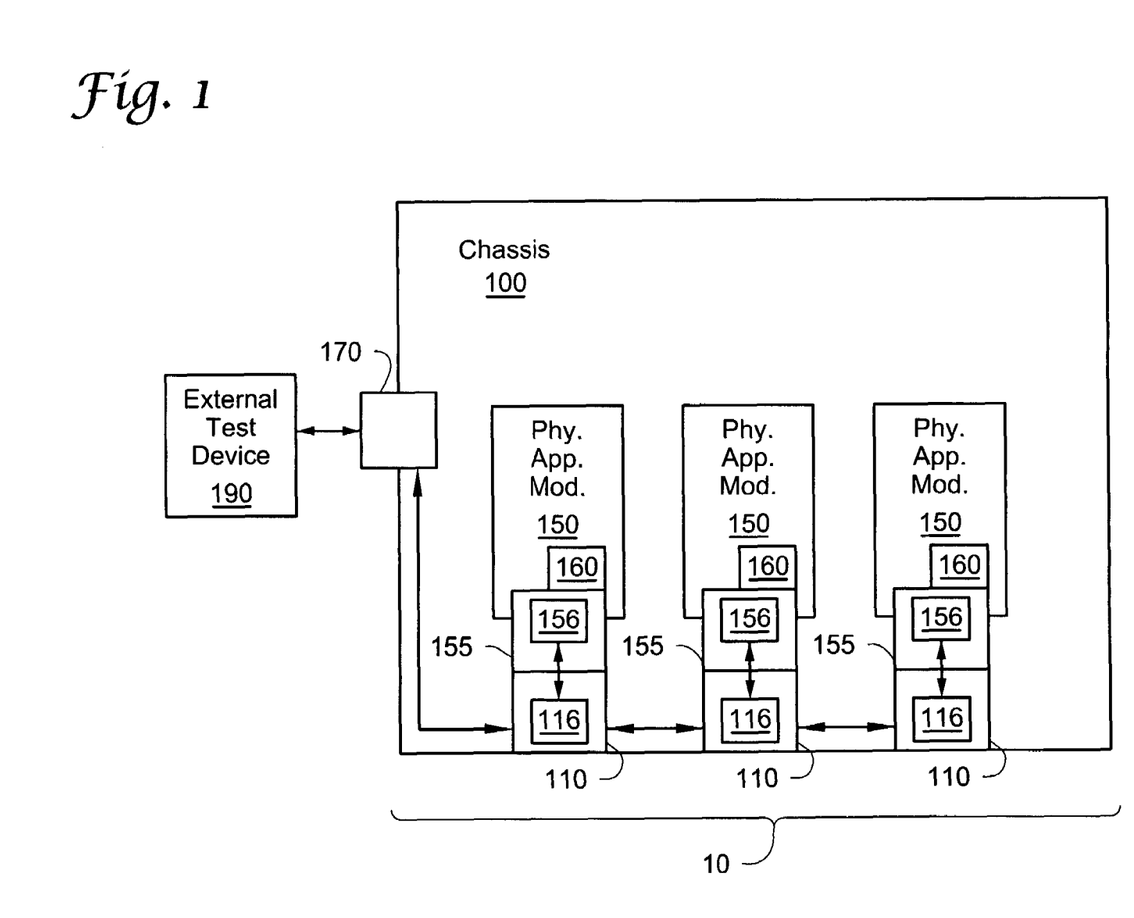
FIG. 1 is a block diagram of one embodiment of a system for testing physical application modules in a chassis by an external test device.

FIG. 1 is a block diagram of one embodiment of a system 10 for testing physical application modules 150 in a chassis 100 by an external test device 190. The system 10 comprises a chassis 100 for receiving a plurality of physical application modules 150. The chassis 100 comprises a test port 170 and a plurality of chassis bridge interfaces 110. Each physical application module 150 comprises a module bridge interface 155 and boundary-scan test functionality 160. When a physical application module 150 is inserted in the chassis 100, the module bridge interfaces 155 are connected to one of the chassis bridge interfaces 110.

Each of the plurality of chassis bridge interfaces 110 comprises a bridge 116 to selectively communicate data between the test port 170 and any physical application module 155 that is communicatively coupled to the respective chassis bridge interface 110. The module bridge interface 155 of each of the plurality of physical application modules 150 includes a bridge 156 that selectively communicates signals from the bridge 116 to the boundary-scan test functionality 160 of the respective physical application module 150.

The test port 170 is communicatively coupled to each of the chassis bridge interfaces 110 in the chassis 100. As shown in FIG. 1, the test port 170 is in a "daisy chain" communication configuration in which the test port 170 is coupled to a first chassis bridge interface 110, which in turn is coupled to a second chassis bridge interface 100, which in turn is coupled to a third chassis bridge interface 100, and so on. In other embodiments, the test port 170 and the chassis bridge interfaces 110 are communicatively coupled to each other in other ways (for example, using a linear bus or star or daisy-chain topology).

In the embodiment shown in FIG. 1, the test port 170 is used to communicatively couple the external test device 190 to the chassis 100 (more specifically, to the chassis bridge interfaces 100 and any physical application modules 150 coupled thereto). When the module bridge interface 155 of each of the physical application modules 150 is communicatively coupled to a respective one of the plurality of chassis bridge interfaces 110, the boundary-scan test functionality 160 of the respective physical application module 150 is communicatively coupled to the external test device 190 via the test port 170.

In one implementation of this embodiment, all of the illustrated physical application modules 150 are the same. In another implementation of this embodiment, at least one of the physical application modules 150 is different from the other physical application modules 150. In one implementation of this embodiment, at least one physical application module 150 comprises a circuit board.

In yet another implementation of this embodiment, the communication bridge interfaces 110 are not part of the chassis 100 but are included in a backplane that is enclosed in or forms a part of the chassis 100.

Figure 2:
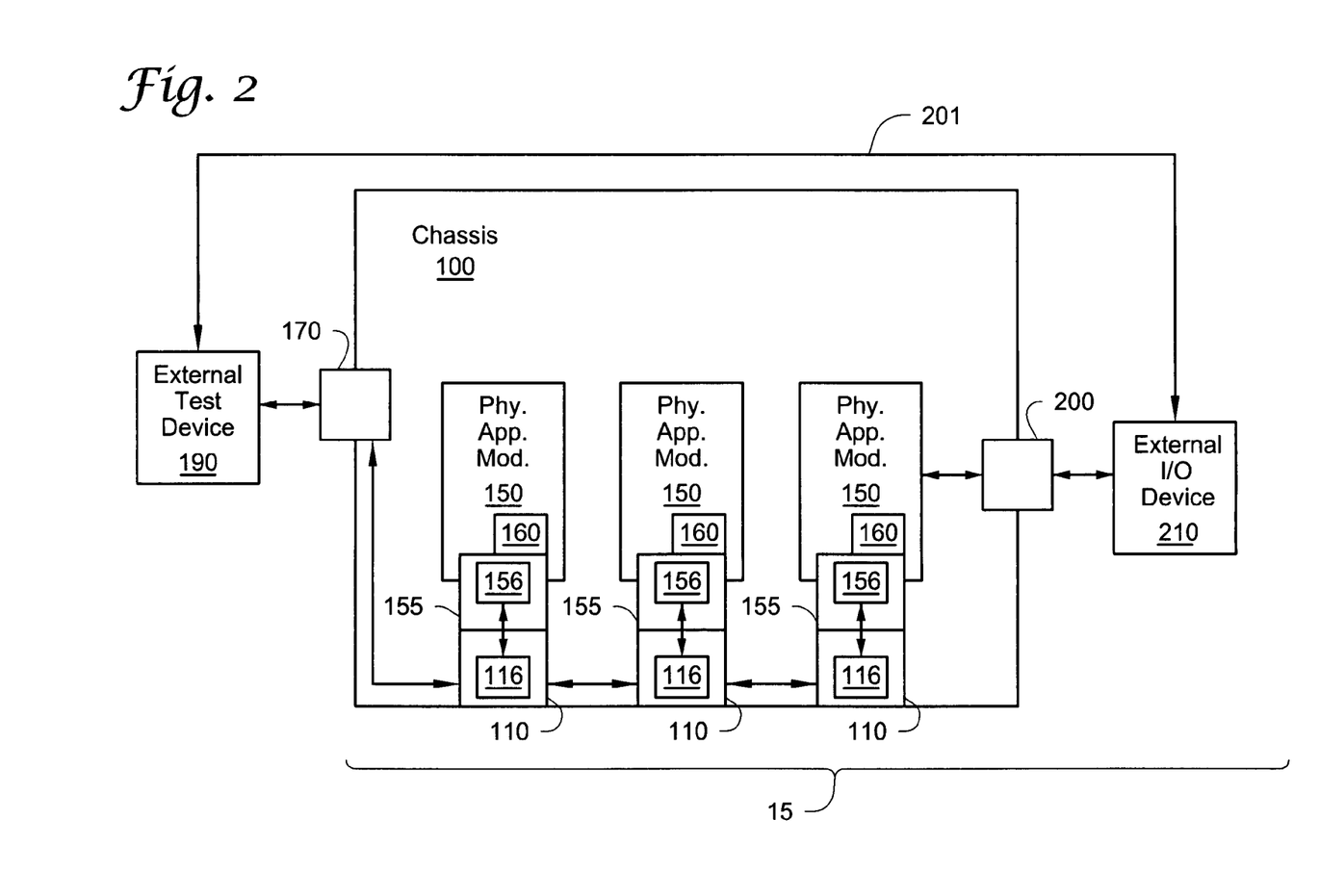
FIG. 2 is a block diagram of one embodiment of a system for testing physical application modules in a chassis by an external test device.

FIG. 2 is a block diagram of one embodiment of a system 15 for testing physical application modules 150 in a chassis 100 by an external test device 190. System 15 comprises system 10, as described above with reference to FIG. 1, in communication with an external input/output device 210 that is external to the chassis 100. In such an embodiment, the chassis 100 comprises an external input/output connector 200 for communicatively coupling the external input/output device 210 to the boundary-scan test functionality 160 of the plurality of physical application modules 150. This is done by directly coupling the external input/output connector 200 to the boundary-scan test functionality 160 of one of the plurality of physical application modules 150 (the right-most physical application module 150 shown in FIG. 2). In order to test signals between two points on a given communication path, each such point needs to be terminated with a device that is capable of being boundary-scan controlled. For example, the boundary-scan test functionality 160 of each physical application module 150 provides boundary-scan control for points located on that physical application module 150. The external input/output device 210 terminates signals coming out of the chassis 100 that are not normally terminated. During a test of a given physical application module 150, the external input/output device 210 terminates signals, as needed for the test, so that all the connections on a physical application module 150 are able to be tested.

In one implementation of this embodiment, the external input/output device 210 comprises a boundary scan capable device that terminates signals communicated thereto. In another implementation of this embodiment, system 15 includes a plurality of external input/output devices 210 communicatively coupled to the boundary-scan test functionality 160 of a respective plurality of physical application modules 150 (that is, one external input/output device 210 is directly communicatively coupled to the boundary-scan test functionality 160 of one of the plurality of physical application modules 150). The number of external input/output devices 210 in system 15 is dependent upon the number of external interfaces that require termination during testing.

In yet another implementation of this embodiment, the external input/output device 210 only terminates signals generated within the chassis 100 by the physical application module 150. In yet another implementation of this embodiment, the external input/output device 210 terminates signals generated from within the chassis 100 and from outside of the chassis 100. In yet another implementation of this embodiment, the external input/output device 210 is communicatively coupled to the external test device 190 to receive input to terminate the signals during a test of the boundary-scan test functionality 160 on the physical application module 150. In this case the external test device 190 sends signals to the external input/output device 210 via connection 201.

In yet another implementation of this embodiment, the external input/output device 210 is communicatively coupled to the physical application module 150 to receive input to terminate the signals during a test of the boundary-scan test functionality 160 on the physical application module 150. In this case the physical application module 150 sends signals to the external input/output device 210 via the external input/output connector 200.

Figure 3:
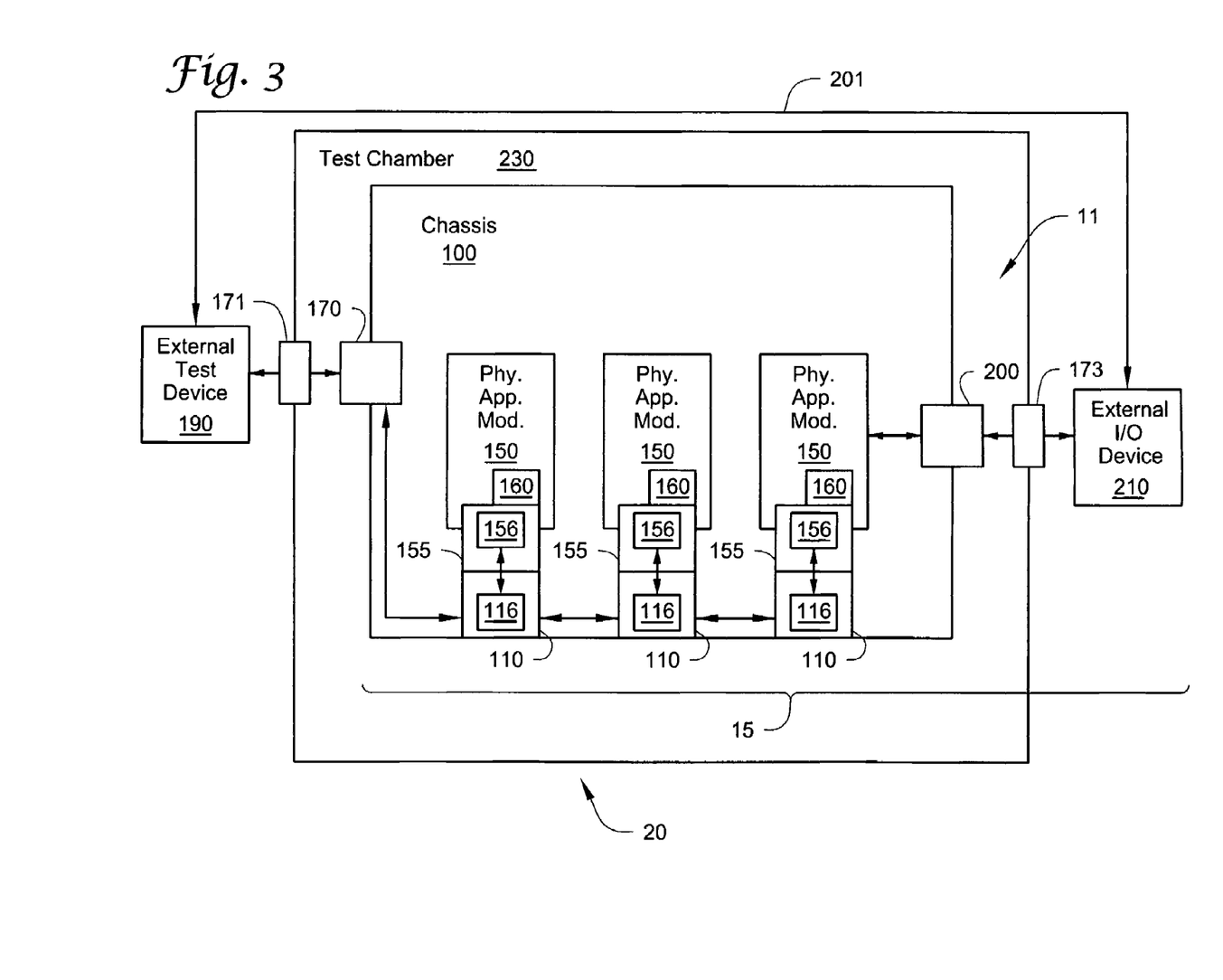
FIG. 3 is a block diagram of one embodiment of a test system.

FIG. 3 is a block diagram of one embodiment of a test system 20. In the illustrated implementation of this embodiment, the test system 20 includes the system 15 described above with reference to FIG. 2, the external test device 190, and a test chamber 230.

In this implementation of the embodiment, the test chamber 230 encloses the test port 170, the external input/output connector 200 and the chassis 100, which encloses the physical application modules 150 and the respective communication bridge interfaces 110. The physical application modules 150, the respective communication bridge interfaces 110, and the external input/output connector 200 are defined herein as the unit under test 11. The external test device 190 is external to the test chamber 230 and is communicatively coupled to the unit under test 11. As shown in FIG. 3, the external input/output device 210 is outside of the test chamber 230 and is communicatively coupled to the unit under test 11 via a first chamber port 171 included in the test chamber 230. As shown in FIG. 3, the external input/output device 210 is outside of the test chamber 230 and is communicatively coupled to the boundary-scan test functionality 160 of at least one of the plurality of physical application modules 150 via the external input/output connector 200 and a second chamber portion 173 included in the test chamber 230. The external input/output device 210 is external to the unit under test 11.

The test chamber 230 includes or is coupled to appropriate functionality to produce a test environment characterized by at least one environmental parameter having an environmental parameter range. In one implementation of this embodiment, the environmental parameter is within an extreme range of the environmental parameter range as described in detail below with reference to FIG. 5.

In this manner, the test system 20 communicatively couples a test port 170 of a unit under test 11 to an external test device 190 that is external to the test chamber 230. The test system 20 communicatively couples boundary-scan test functionality 160 included on each of a plurality of physical application modules 150 to respective communication bridge interfaces 110 and thereby to the external test device 190.

Figure 4:
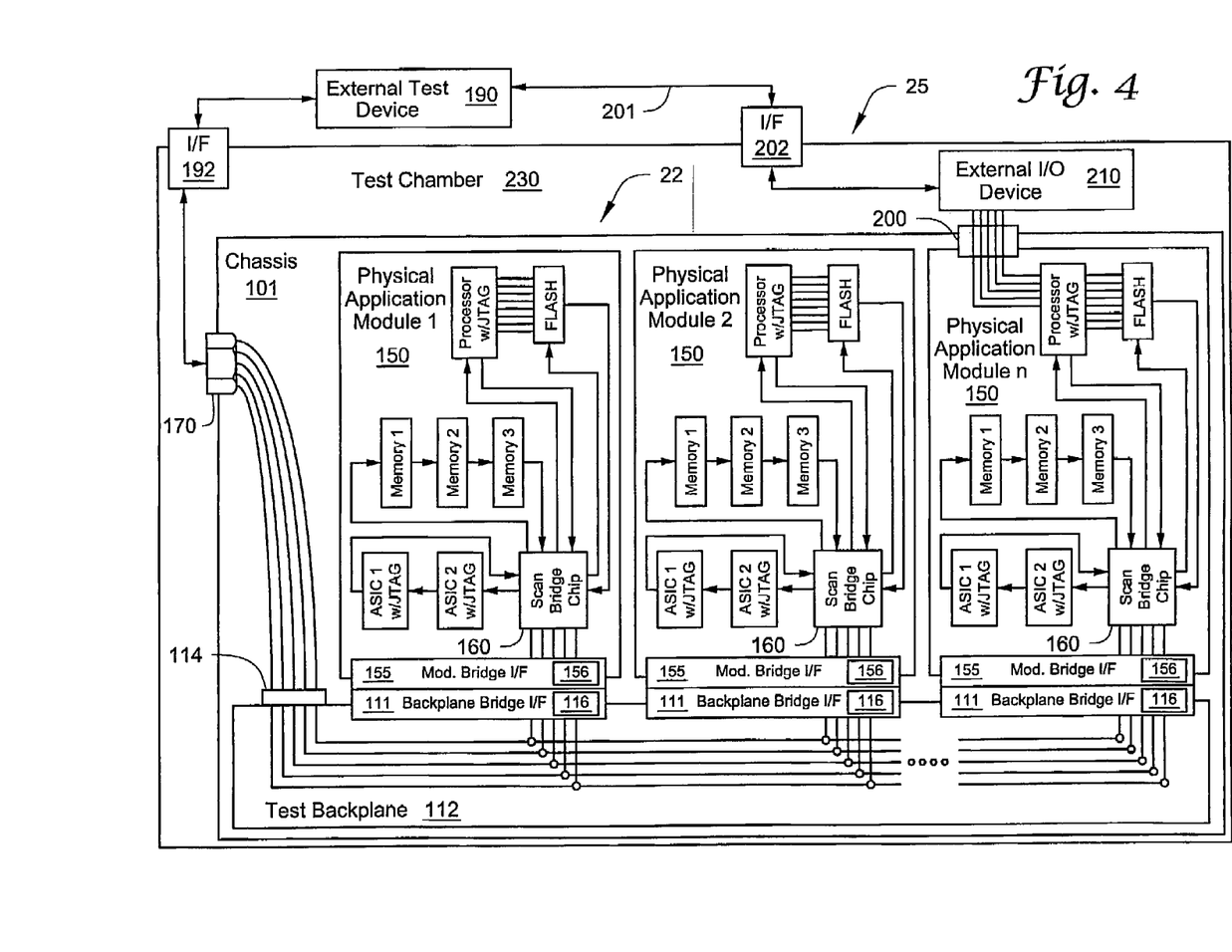
FIG. 4 is a block diagram of one embodiment of a test system.

FIG. 4 is a block diagram of one embodiment of a test system 25 operable for testing physical application modules 150 in a test chamber 230 by an external test device 190. Test system 25 includes the test chamber 230, a unit under test 22 enclosed within the test chamber 230 and the external test device 190, which is external to the test chamber 230. In the context of FIG. 4, unit under test 22 comprises the test port 170, the chassis 101, the external input/output connector 200 and the external input/output device 210. In this embodiment, chassis 101 includes a test backplane 112 which replaces the plurality of chassis bridge interfaces 110. The test backplane 112 includes an external test interface 114 and backplane bridge interfaces 111.

The backplane bridge interfaces 111 are similar in function to the chassis bridge interfaces 110. The backplane bridge interfaces 111 comprise the bridge 116, which is operable to selectively communicate data between the test port 170 and any physical application module 150 that is communicatively coupled to the respective chassis bridge interface 111. In this manner, the test backplane 112 provides the connection that the plurality of chassis bridge interfaces 110 provided in test system 20 as described above with reference to FIG. 3.

In test system 25, the external input/output connector 200 is communicatively coupled an external input/output device 210 to terminate signals during a test of the boundary-scan test functionality 160 of at least one of the plurality of physical application modules 150. The external input/output device 210 is external to the chassis 101 and within the test chamber 230. In one implementation of this embodiment, the external input/output device 210 is communicatively coupled to the external test device 190 to receive input to terminate the signals during a test of the boundary-scan test functionality 160 on the physical application module 150. In this case the external test device 190 sends signals to the external input/output device 210 via connection 201 and via a test chamber interface (I/F) 202.

The external test interface 114 is communicatively coupled to the test port 170 and the external test interface 114 is communicatively coupled to the plurality of backplane bridge interfaces 111 via the test backplane 112. In this embodiment, when the module bridge interfaces 155 are mated to a respective backplane bridge interface 111, the physical application modules 150 are communicatively coupled to the external test interface 114 and the test port 170. The external test device 190 is communicatively coupled to the unit under test 22 via a test chamber interface (I/F) 192. In one implementation of this embodiment, the external test device 190 is communicatively coupled to the unit under test 22 and the external input/output device 210 via the test chamber interface 192. In this case the external input/output device 210 is communicatively coupled to the test chamber interface 192 and the test chamber interface 202 is not included in the test system 25.

In another implementation of this embodiment, the boundary-scan test functionality 160 is provided by a boundary-scan bridge chip as shown in FIG. 4.

Figure 5:
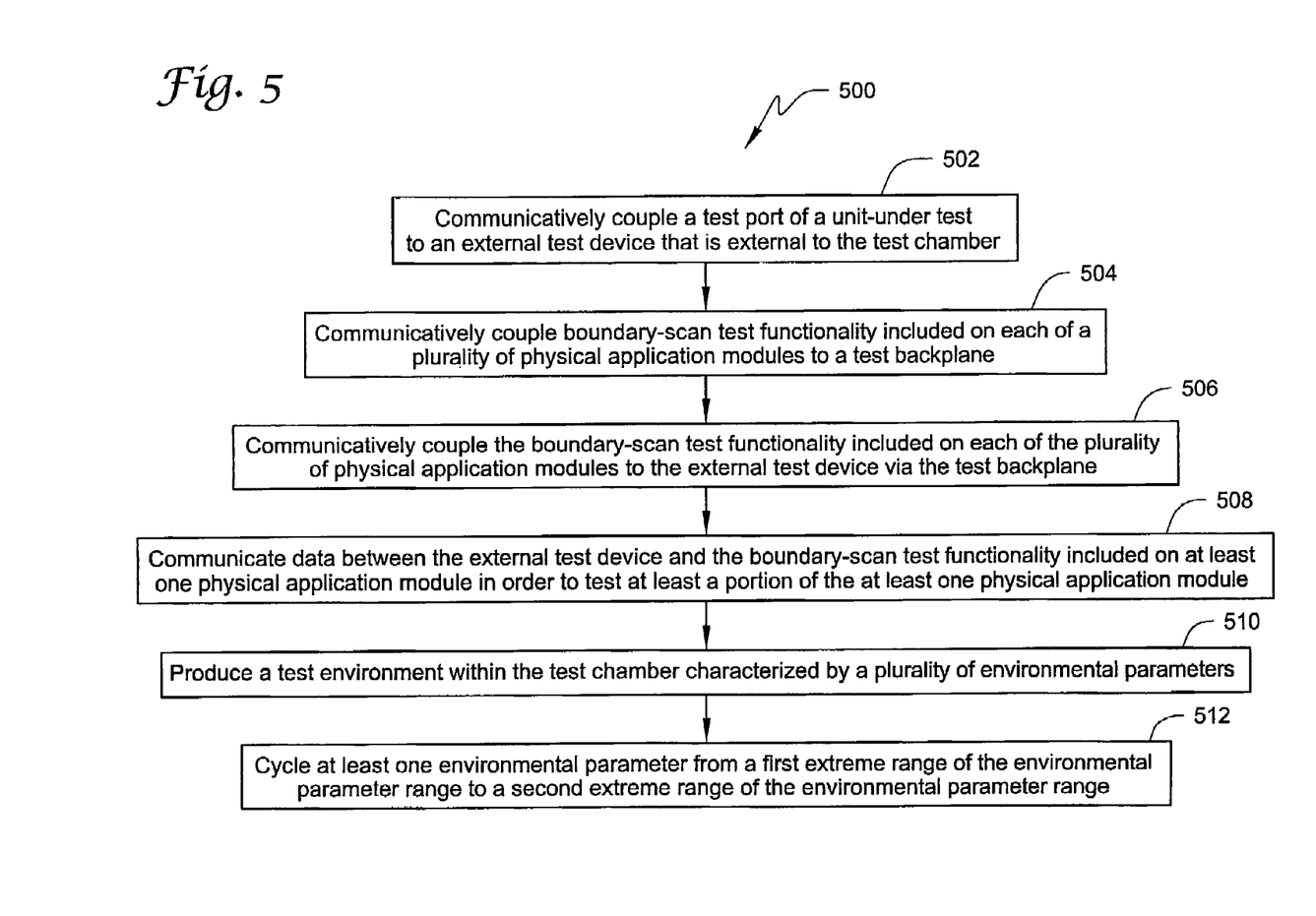
FIG. 5 shows a flow diagram of one embodiment a method to test a unit under test while the unit under test is functioning at operating speed within a test environment.

FIG. 5 shows a flow diagram of one embodiment a method 500 to test a unit under test while the unit under test is functioning at operating speed within a test environment. The method 500 is described with reference to and is operating with the test system 25 of FIG. 4. In one implementation of such an embodiment, at least a portion of the processing of method 500 is implemented in software that is executed by the external test device 190. For example, in one such implementation, the external test device 190 comprises a programmable processor (not shown) that executes appropriate program instructions (for example, program instructions that are embodied on or in a suitable storage medium from which such program instructions are read for execution by the programmable processor of the external device 190).

At block 502, the test port 170 of the unit under test 22 is communicatively coupled to the external test device 190 (which is external to the test chamber 230). The external test device 190 is communicatively coupled to the unit under test 22 via a test chamber interface 192. The test chamber interface 192 is communicatively coupled to the test port 170. The test port 170 is communicatively coupled to the external test interface 114. In one implementation of this embodiment, the communicative coupling between and among the test chamber interface 192, the test port 170 and the external test interface 114 is provided by trace lines, lead lines, wires and the like.

At block 504, boundary-scan test functionality 160 included on each of the plurality of physical application modules 150 is communicatively coupled to the test backplane 112. The module bridge interface 155 is "adapted to" mate to a particular backplane bridge interface 111, in one implementation, by selecting a connector that is able to mate with (that is, connect to) the backplane bridge interface 111 of such a test backplane 112 (for example, by using the same type of connector as used on the respective application module to communicatively couple the application module to the backplane).

The module bridge interface 155 of each of the plurality of physical application modules 150 comprises a bridge 156 that is communicatively coupled to the boundary-scan test functionality 160. The backplane bridge interfaces 111 each comprise a bridge 116, which is operable to selectively communicate data to and from the bridge 156 when the module bridge interface 155 is mated to a respective backplane bridge interface 111. Data received at the bridge 116 from the backplane 112 is input to the bridge 156. Data received at the bridge 156 from the boundary-scan test functionality 160 is input to the bridge 116.

At block 506, the boundary-scan test functionality 160 included on each of the plurality of physical application modules 150 is communicatively coupled to the external test device 190 via the test backplane 112. Data communicated between the boundary-scan test functionality 160 and the test backplane 112 is communicated to the test port 170 via the external test interface 114. In one implementation of this embodiment, the communication on the test backplane 112 from the backplane bridge interface 111 is via trace lines, wire and/or lead lines on the test backplane 112.

At block 508, data is communicated between the external test device 190 and the boundary-scan test functionality 160 included on at least one physical application module 150 in order to test at least a portion of the at least one physical application module. In one implementation of this embodiment, the boundary-scan test functionality 160 of each physical application module 150 comprises joint test access group (JTAG) functionality and the test port 170 is a JTAG port (that is, supports the signals specified by the JTAG standards and specifications). In yet another implementation of this embodiment, the boundary-scan test functionality 160 comprises a boundary-scan bridge chip that operates according to the specification defined by the Institute of Electrical and Electronics Engineers (IEEE) 1149.1 standards and/or the IEEE 1149.6 standards. In yet another implementation of this embodiment, the external test device 190 is a JTAG computer. In yet another implementation of this embodiment, the external test device includes test sequences (also referred to as test cases) and the "commercial off the shelf" (COTS) test software that drives the test.

At block 510, a test environment is produced within the test chamber 230. The test environment is characterized by a plurality of environmental parameters, where each environmental parameter has an environmental parameter range and wherein at least one environmental parameter is within an extreme range of the environmental parameter range. In the embodiment described here in connection with FIGS. 3 and 4, the environmental parameter is selected from the group comprising temperature, air pressure, gas pressure, vibration, radiation level, cosmic radiation level, radio-active radiation level, pH level, saline level, humidity and combinations thereof. In one implementation of such an embodiment, the test chamber 230 includes or is coupled to appropriate functionality to produce a testing environment that cycles the environmental parameter from a first extreme range of the environmental parameter range to a second extreme range of the environmental parameter range.

In this manner, the test system 25 communicatively couples a test port 170 of a unit under test 22 to the external test device 190 that is external to the test chamber 230, the test system 25 communicatively couples boundary-scan test functionality 160 included on each of a plurality of physical application modules 150 to a test backplane 112 and the test system 25 communicatively couples the boundary-scan test functionality 160 included on each of the plurality of physical application modules 150 to the external test device 190 via the test backplane 112.

In one implementation of this embodiment, temperature is the environmental parameter and temperatures below minus 40° C. are in the first extreme range of environmental parameter range and temperatures above 50° C. are in the second extreme range of the environmental parameter range. In an exemplary test, the test chamber 230 produces a testing environment in which the unit under test 22 is exposed to temperatures under minus 40° C. for three months. In another exemplary test, the test chamber 230 cycles the environment parameter to produce a testing environment in which the unit under test 22 is exposed to temperatures under minus 40° C. for three months and the unit under test 22 is exposed to temperatures under above 50° C. for three months. In another exemplary test, the test chamber 230 cycles the environment parameter to produce a testing environment in which the unit under test 22 is exposed to temperatures under minus 40° C. for one day and the unit under test 22 is exposed to temperatures under above 50° C. for day. In this exemplary test, the environment parameter range is within the normal environment parameter range when the temperature is between minus 40° C. and 50° C. In one implementation of this embodiment, there is a third extreme range of environmental parameter range. To extend the latter exemplary case, the first extreme range of environmental parameter range is below minus 40° C., the second extreme range of environmental parameter range is above 50° C., and the third extreme range of environmental parameter range is between minus 40° C. and minus 20° C.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A system comprising:
a chassis configured to communicatively couple a plurality of physical application modules, each physical application module comprising a module bridge interface and a boundary-scan test functionality, the boundary-scan test functionality being enabled to perform boundary-scan test functions on the respective physical application module; and
a test port via which an external test device is communicatively coupled to the system, wherein the test port is communicatively coupled to each of a plurality of chassis bridge interfaces in the chassis,
wherein, when the module bridge interface of each of the physical application modules is communicatively coupled to a respective one of the plurality of chassis bridge interfaces in a daisy-chain configuration, then each physical application module is communicatively coupled to the test port and the boundary-scan test functionality is enabled for each physical application module, wherein the boundary-scan test functionalities in the plurality of physical application modules together enable distribution of a scan chain across the plurality of daisy chained physical application modules, and wherein data is communicated without the need of a switch from the external test device to the plurality of physical application modules.

2. The system of claim 1, wherein at least one physical application module comprises a circuit board.

3. The system of claim 1, wherein the boundary-scan test functionalies comprise joint test access group (JTAG) functionalies and the external test interface comprises a JTAG interface.

4. The system of claim 1, the system further comprising:
a test backplane enclosed by the chassis, the test backplane comprising an external test interface and the plurality of chassis bridge interfaces, wherein the external test interface is communicatively coupled to the test port, and wherein the external test interface is communicatively coupled to the plurality of chassis bridge interfaces via the test backplane, wherein each of the plurality of chassis bridge interfaces comprises a bridge to selectively communicate data between the external test interface and any physical application module that is communicatively coupled to the respective chassis bridge interface.

5. The system of claim 4, wherein the module bridge interface of each of the plurality of physical application modules comprises a bridge operable to selectively communicate signals from the test backplane to the respective physical application module enabled for boundary-scan test functions.

6. The system of claim 1, further comprising an external input/output connector to communicatively couple an external input-output device to the boundary-scan test functionality of at least one of the plurality of physical application modules, wherein the external input-output device is external to the chassis.

7. The system of claim 6, wherein the external input/output device comprises a joint test access group (JTAG) device that terminates signals communicated thereto.

8. The system of claim 1, wherein the test port is communicatively coupled to each chassis bridge interface in the plurality of chassis bridge interfaces in a daisy chain configuration.

9. A test system comprising:
a test chamber;
a unit under test enclosed within the test chamber; and
an external test device external to the test chamber and the unit under test, wherein the external test device is communicatively coupled to the unit under test;
wherein the unit under test comprises:
a chassis configured to communicatively couple a plurality of physical application modules, each physical application module comprising a module bridge interface and a boundary-scan test functionality, the boundary-scan test functionality being enabled to perform boundary-scan test functions on the respective physical application module; and
a test port via which the external test device is communicatively coupled to a plurality of chassis bridge interfaces in the chassis,
wherein, when the module bridge interface of each of the physical application modules is communicatively coupled to a respective one of the plurality of chassis bridge interfaces in a daisy-chain configuration, each physical application module is communicatively coupled to the test port and the boundary-scan test functionality is enabled for each of the respective physical application modules, wherein a scan chain is distributed across the plurality of daisy chained physical application modules, and wherein data is communicated without the need of a switch from the external test device to the physical application module using the respective boundary-scan test functionality.

10. The test system of claim 9, the unit under test further comprising:
a test backplane enclosed by the chassis, the test backplane comprising an external test interface and the plurality of chassis bridge interfaces, wherein the external test interface is communicatively coupled to the test port, and wherein the external test interface is communicatively coupled to the plurality of chassis bridge interfaces via the test backplane.

11. The test system of claim 9, wherein the testing chamber is operable to produce a test environment characterized by at least one environmental parameter having an environmental parameter range, wherein the environmental parameter is within an extreme range of the environmental parameter range.

12. The test system of claim 11, wherein the environmental parameter is selected from the group comprising temperature, air pressure, gas pressure, vibration, radiation level, cosmic radiation level, radio-active radiation level, pH level, saline level, humidity and combinations thereof.

13. The test system of claim 11, wherein the testing chamber is operable to produce a testing environment that cycles the environmental parameter from a first extreme range of the environmental parameter range to a second extreme range of the environmental parameter range.

14. The test system of claim 9, further comprising an external input/output device, wherein the unit under test further comprises an external input/output connector to communicatively couple the external input/output device to the module bridge interface enabling the boundary-scan test functionality of at least one of the plurality of physical application modules, wherein the external input-output device is external to the unit under test.

15. The test system of claim 14, wherein the external input/output device is within the test chamber.

16. The test system of claim 14, wherein the external input/output device is outside of the test chamber.

17. The test system of claim 14, wherein the external input/output device comprises a joint test access group (JTAG) device that terminate signals communicated thereto.

18. A method comprising:
communicatively coupling a test port of a unit under test to an external test device that is external to a test chamber;
communicatively coupling a boundary-scan test functionality included on each of a plurality of physical application modules in the unit under test to a test backplane via a respective module bridge interface;
communicatively coupling the boundary-scan test functionality included on each of the plurality of physical application modules to the external test device via the test backplane, wherein the boundary-scan test functionalities together enable distribution of a scan chain across the plurality of physical application modules; and
communicating data without the need of a switch from the external test device to the plurality of physical application modules in order to test plurality of physical application modules.

19. The method of claim 18, further comprising producing a test environment within the test chamber characterized by a plurality of environmental parameters, each environmental parameter having an environmental parameter range and wherein at least one environmental parameter is within an extreme range of the environmental parameter range.

20. The method of claim 19, wherein the environmental parameters are selected from the group comprising temperature, air pressure, gas pressure, vibration, radiation level, cosmic radiation level, radio-active radiation level, pH level, saline level, humidity and combinations thereof.

21. The method of claim 19, further comprising cycling at least one environmental parameter from a first extreme range of the environmental parameter range to a second extreme range of the environmental parameter range.

22. An apparatus comprising:
means for communicatively coupling a test port of a unit under test to a test device that is external to a test chamber;
means for performing a boundary-scan test function on each of a plurality of physical application modules in the unit under test;
means for communicatively coupling the means for performing the boundary-scan test function on each of the plurality of physical application modules to a test backplane;
means for communicatively coupling the means for performing the boundary-scan test function on each of the plurality of physical application modules to the test device via the test backplane, wherein the means for performing the boundary-scan test function on each of the plurality of physical application modules together enable distribution of a scan chain across the plurality of physical application modules; and and wherein data is communicated without the need of a switch from the test device to the plurality of physical application modules in order to test the plurality of physical application modules.

* * * * *

UNITED STATES PATENT AND TRADEMARK OFFICE
CERTIFICATE OF CORRECTION

| | |
|---|---|
| PATENT NO. | : 7,511,525 B2 |
| APPLICATION NO. | : 11/340295 |
| DATED | : March 31, 2009 |
| INVENTOR(S) | : Jaworski et al. |

It is certified that error appears in the above-identified patent and that said Letters Patent is hereby corrected as shown below:

At Column 1, line 16, after the text ending with "on the same date herewith", insert the following text: --and are hereby incorporated herein by reference--

Signed and Sealed this

Thirteenth Day of October, 2009

David J. Kappos
*Director of the United States Patent and Trademark Office*